(12) United States Patent
Yao

(10) Patent No.: US 11,792,945 B2
(45) Date of Patent: Oct. 17, 2023

(54) ROLLABLE DISPLAY DEVICE

(71) Applicant: Hubei Yangtze Industrial Innovation Center Of Advanced Display Co., Ltd., Wuhan (CN)

(72) Inventor: Qijun Yao, Shanghai (CN)

(73) Assignee: HUBEI YANGTZE INDUSTRIAL INNOVATION CENTER OF ADVANCED DISPLAY CO., LTD., Wuhan (CN)

( * ) Notice: Subject to any disclaimer, the term of this patent is extended or adjusted under 35 U.S.C. 154(b) by 283 days.

(21) Appl. No.: 17/106,738

(22) Filed: Nov. 30, 2020

(65) Prior Publication Data

US 2022/0104369 A1 Mar. 31, 2022

(30) Foreign Application Priority Data

Sep. 28, 2020 (CN) .......................... 202011043377.7

(51) Int. Cl.
*H04M 1/02* (2006.01)
*H05K 5/02* (2006.01)
(Continued)

(52) U.S. Cl.
CPC ........... *H05K 5/0217* (2013.01); *G09F 9/301* (2013.01); *H04M 1/0235* (2013.01);
(Continued)

(58) Field of Classification Search
CPC .... H05K 5/0217; H05K 5/0017; H05K 1/189; H05K 2201/10128; H01L 51/5237;
(Continued)

(56) References Cited

U.S. PATENT DOCUMENTS 11,140,252 B1\* 10/2021 Choi ..................... H04N 5/2253
2018/0102072 A1\* 4/2018 Lee ........................ G06F 1/1641
(Continued)

FOREIGN PATENT DOCUMENTS

CN 107591090 A 1/2018
CN 107919063 A 4/2018
(Continued)

*Primary Examiner* — Steven T Sawyer
(74) *Attorney, Agent, or Firm* — Anova Law Group, PLLC

(57) ABSTRACT

A rollable display device includes a rollable screen, including a non-display part and a display part; and a telescopic mechanism. The rollable screen is laid surrounding the telescopic mechanism. The display part includes a fixed display portion and a rollable display portion. The fixed display portion is fixed on a first plane, and the non-display part is connected to the side of the rollable display portion away from the fixed display portion. The side of the non-display part away from the display part is connected to the telescopic mechanism. In a process of extension or retraction, the telescopic mechanism is configured to drive the rollable display portion to slide and bend. In the retracted state, the orthogonal projection of the rollable display portion at least partially overlaps with the fixed display portion. In the extended state, the orthogonal projection of the rollable display portion unoverlaps with the fixed display portion.

15 Claims, 7 Drawing Sheets

(51) Int. Cl.
    *H05K 5/00*   (2006.01)
    *H10K 50/84*  (2023.01)
    *G09F 9/30*   (2006.01)
    *H05K 1/18*       (2006.01)
    *H10K 102/00*     (2023.01)
    *G06F 1/16*       (2006.01)

(52) U.S. Cl.
    CPC ........ *H04M 1/0268* (2013.01); *H05K 5/0017* (2013.01); *H10K 50/84* (2023.02); *G06F 1/1652* (2013.01); *H05K 1/189* (2013.01); *H05K 2201/10128* (2013.01); *H10K 2102/311* (2023.02)

(58) Field of Classification Search
    CPC ........ H01L 2251/5338; H04M 1/0235; H04M 1/0268; G06F 1/1652; G09F 9/301
    See application file for complete search history.

(56) References Cited

U.S. PATENT DOCUMENTS

| | | | | |
|---|---|---|---|---|
| 2019/0212780 A1* | 7/2019 | Choi | ................ | G02F 1/133 |
| 2019/0213925 A1* | 7/2019 | Ha | ................ | G09F 9/301 |
| 2020/0163231 A1* | 5/2020 | Park | ................ | H10K 50/841 |
| 2020/0337161 A1* | 10/2020 | Choi | ................ | H10K 50/84 |
| 2022/0317736 A1* | 10/2022 | Li | ................ | G06F 1/1626 |
| 2022/0397937 A1* | 12/2022 | Sun | ................ | G06F 1/1652 |

FOREIGN PATENT DOCUMENTS

| | | |
|---|---|---|
| CN | 108230937 A | 6/2018 |
| CN | 109857198 A | 6/2019 |
| CN | 110033707 A | 7/2019 |
| CN | 110211499 A | 9/2019 |
| CN | 110930880 A | 3/2020 |
| CN | 111294434 A | 6/2020 |

* cited by examiner

ROLLABLE DISPLAY DEVICE

CROSS-REFERENCES TO RELATED APPLICATIONS

This application claims the priority of Chinese patent application No. 202011043377.7, filed on Sep. 28, 2020, the entirety of which is incorporated herein by reference.

FIELD OF THE DISCLOSURE

The present disclosure generally relates to the field of display technology and, more particularly, relates to a rollable display device.

BACKGROUND

Nowadays, flexible display panels have gradually entered the field of vision of consumers, and the rollability of the screen has greatly expanded the application in the display field. Compare with conventional screens, flexible screens demonstrate a variety of advantages. For example, flexible screens are not only lighter and thinner in size, but also lower in power consumption than conventional screens, which helps to improve the endurance of the devices. At the same time, based on the characteristics of bendability and flexibility, the durability of flexible screens is much higher than that of conventional screens.

When a flexible screen is used in a display device, the flexible screen is usually a foldable screen or a rollable screen. The foldable screen needs to have folding connection components, e.g., a connection reel or a hinge structure disposed at the bending place, for folding, and thus the foldable screen may be difficult to design and the cost may be high. For a rollable screen, the area of the display region can be adjusted, and the screen can be rolled when not in use, which is convenient for storage and saves space.

However, in current rollable display devices, a flexible screen is usually wound on a reel, and the display area of the flexible screen can be changed through stretching and winding. When the flexible screen is stretched or rewound, the portion of the flexible screen rolled up in the region of the reel may be warped. At the same time, because the stretching and rewinding is directly applied to the flexible screen, the internal structure of the flexible screen may be easily damaged, thereby affecting the performance of the flexible screen.

The disclosed rollable display device is directed to solve one or more problems set forth above and other problems in the art.

BRIEF SUMMARY OF THE DISCLOSURE

One aspect of the present disclosure provides a rollable display device. The rollable display device includes a rollable screen, including a non-display part and a display part; and a telescopic mechanism. The rollable screen is laid surrounding the surface of the telescopic mechanism. The display part includes a fixed display portion and a rollable display portion that are connected to each other. The fixed display portion is fixed on a first plane for display, and the non-display part is connected to the side of the rollable display portion away from the fixed display portion. The side of the non-display part away from the display part is connected to the telescopic mechanism. In a process of extension or retraction, the telescopic mechanism is configured to drive the rollable display portion, through the non-display part, to slide and bend on the surface of the telescopic mechanism. In the retracted state of the telescopic mechanism, the orthogonal projection of the rollable display portion on the first plane at least partially overlaps with the fixed display portion; and in the extended state of the telescopic mechanism, the orthogonal projection of the rollable display portion on the first plane unoverlaps with the fixed display portion.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
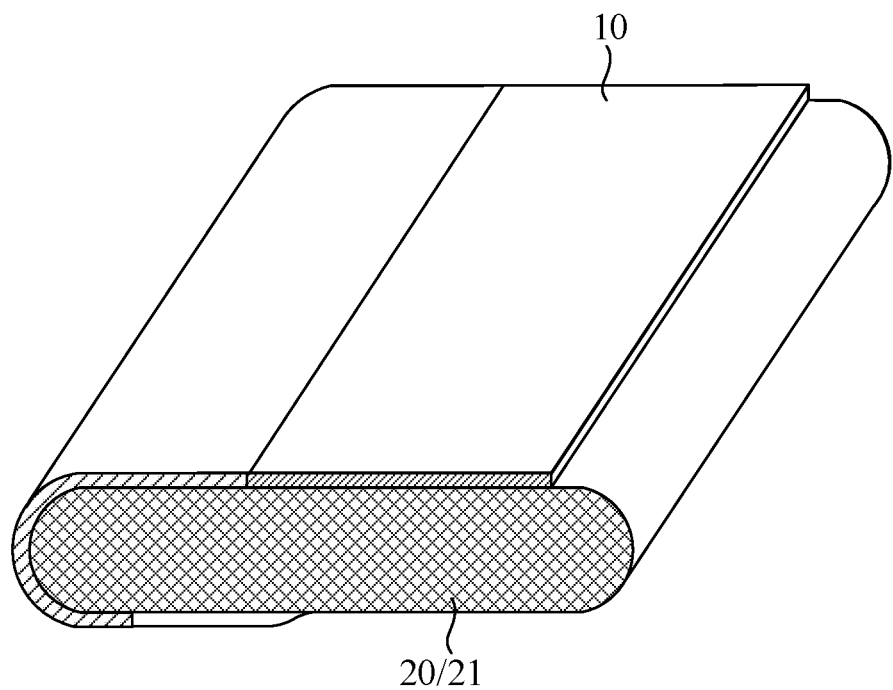
FIG. 1 illustrates a schematic structural diagram of an exemplary rollable display device according to various embodiments of the present disclosure.

Various exemplary embodiments of the present disclosure will now be described in detail with reference to the accompanying drawings. It should be noted that unless specifically stated otherwise, the relative arrangement of the components and steps, numerical expressions and numerical values set forth in the embodiments do not limit the scope of the present disclosure. The following description of the at least one exemplary embodiment is merely illustrative, and by no means can be considered as limitations for the application or use of the present disclosure. In addition, it should be noted that, for illustrative purposes, the drawings show, instead of all of the structure, only a part of the structure related to the present disclosure.

It should be noted that techniques, methods, and apparatuses known to those of ordinary skill in the relevant art may not be discussed in detail, but where appropriate, the techniques, methods, and apparatuses should be considered as part of the specification.

It should be noted that in all the examples provided and discussed herein, any specific value should be interpreted as merely exemplary and not as a limitation. Therefore, other examples of the exemplary embodiments may have different values.

It should be noted that similar reference numbers and letters indicate similar items in subsequent figures, and therefore, once an item is defined in a figure, it is not required to be further discussed or defined in the subsequent figures.

Existing flexible screens usually adopt of a foldable-screen form or a rollable-screen form. Although foldable screens are currently more popular, it is difficult to design and manufacture due to the need to design folding connection components, such as hinges. For rollable screens, the structure is relatively simpler, and by rolling the flexible display screen, the flexible display screen can be retracted, or be stretched to realize the change of the display area.

However, in current rollable display devices, the flexible display screens are usually directly stretched and wound. Therefore, deformation stress will be generated during the stretching and winding process, and the deformation stress will be directly applied to the flexible display screen, thereby easily causing damages to the internal structure of the display screen and affecting the performance of the display screen. In addition, when the flexible display screen is directly wound on the reel, the display screen needs to be repeatedly bent at a small bending angle, which may easily cause the display screen to warp and thus affect the flatness of the entire display screen.

The present disclosure provides a rollable display device. The rollable display device includes a rollable screen and a telescopic mechanism. The rollable screen is laid surrounding the surface of the telescopic mechanism and includes a non-display part and a display part. The display part includes a fixed display portion and a rollable display portion that are connected with each other. The fixed display portion is fixed on a first plane for display. The non-display part is connected to the side of the rollable display portion away from the fixed display portion. The side of the non-display part away from the display part is connected to the telescopic mechanism.

In the process of extension or retraction, through the non-display part, the telescopic mechanism drives the rollable display portion to slide and bend on the surface of the telescopic mechanism. In the retracted state of the telescopic mechanism, the orthogonal projection of the rollable display portion on the first plane and the fixed display portion at least partially overlap. In the extended state of the telescopic mechanism, the orthogonal projection of the rollable display portion on the first plane unoverlaps with the fixed display portion.

In the rollable display device, the telescopic mechanism is configured to carry, store, and protect the rollable screen. The telescopic mechanism has a telescopic function to cooperate with the rollable screen to slide and bend, so that the rollable screen can switch between the states. The actual display area of the display part in the rollable screen may change according to the state switching. When the telescopic mechanism is in the extended state, the rollable screen may have a larger display area; and when the telescopic mechanism is in the retracted state, the rollable screen may have a smaller display area.

For example, when the telescopic mechanism extends or retracts, the telescopic mechanism may drive the rollable screen to change the actual display area, which involves the connection of the telescopic mechanism and the rollable screen, and the force of the telescopic mechanism acting on specific positions of the rollable screen. Based on this, in various embodiments of the present disclosure, the rollable screen is arranged to include a non-display part and a display part. The telescopic mechanism is mainly connected with the non-display part of the rollable screen, and is configured to, through the non-display part, indirectly apply the stretching force or the winding force to the display part of the rollable screen, so as to change the state of the display part and adjusting the display area. The display part includes a flexible display screen structure, and the non-display part includes another structures for protection or support, which are connected to, attached to, or bonded to the flexible display screen, and thus are capable of driving the flexible display screen to slide or roll.

As disclosed herein, "the fixed display portion of the rollable screen being fixed on the first plane for display" may refer to that the fixed display portion is fixed on the surface of the telescopic mechanism, and the area of the fixed display portion is determined. In other words, the surface is the display surface of the entire rollable display device, and when the rollable display device changes the state, the fixed display portion continuously maintains the display function. The rollable display portion of the rollable screen is a structure that changes its state under the drive of the non-display part. The rollable display portion also has a display function, but corresponding to different states of the rollable display device, the rollable display portion may be extended and retracted. Therefore, when the rollable display portion is in the extended state, the rollable display portion displays simultaneously with the fixed display portion, which ensures a large display area; and when the rollable display portion is in the retracted state, the rollable display portion does not display and only the fixed display portion displays, which realizes displaying in a small area.

For example, the stretched state of the rollable display portion corresponds to the stretched state of the telescopic mechanism, and at this time, the rollable display portion may slide on the surface of the telescopic mechanism and extend on the display surface of the telescopic mechanism, e.g., on the first plane, thereby increasing the display area. Accordingly, the rollable display portion and the fixed display portion are both located in the first plane, and thus the orthogonal projection of the rollable display portion on the first plane does not overlap with the fixed display portion. The retracted state of the rollable display portion corresponds to the retracted state of the telescopic mechanism, and at this time, the rollable display portion may slide on the surface of the telescopic mechanism and bend from the first plane to the side or back of the telescopic mechanism. Accordingly, the fixed display portion is fixed on the first plane, but at least part of the rollable display portion deviates from the first plane and is slidably bent to the back of the telescopic mechanism. Therefore, the orthogonal projection of the rollable display portion on the first plane overlaps with the fixed display portion.

According to the disclosed rollable display device, the display panel includes a rollable screen and a telescopic mechanism. The rollable screen is laid surrounding the surface of the telescopic mechanism. Further, the rollable screen is arranged to include a non-display part and a display part, and the display part includes a fixed display portion and a rollable display portion that are connected with each other. The fixed display portion is fixed in a first plane for display. The non-display part is connected to the side of the rollable display portion away from the fixed display portion. The side of the non-display part away from the display part is connected to the telescopic mechanism. In the process of extension or retraction, through the non-display part, the telescopic mechanism drives the rollable display portion to slide and bend on the surface of the telescopic mechanism. In the retracted state of the telescopic mechanism, the orthogonal projection of the rollable display portion on the first plane and the fixed display portion at least partially overlap. In the extended state of the telescopic mechanism, the orthogonal projection of the rollable display portion on the first plane unoverlaps with the fixed display portion. As such, change in the display area of the rollable display device may be achieved. The embodiments of the present disclosure solve the problem that the flexible screen in existing rollable display device is easily warped, and use a telescopic mechanism to drive the state of the display portion to switch through the non-display part. Therefore, the disclosed rollable display device not only realizes the change of the display area, but also prevents the flexible display screen in the display part from being directly subjected to deformation stress, thereby reducing the damage to the flexible display screen caused by the stretching force or the winding force, and preventing the flexible display screen from deformation such as warping. As such, the flatness of the display screen may be ensured, and the quality of the rollable display device may be improved, thereby increasing the life time of the rollable display device.

The above is the principle of the disclosed rollable display device. The technical solutions in various embodiments of the present disclosure will be described clearly and completely with reference to the accompanying drawings. Based on the embodiments of the present disclosure, all other embodiments obtained by those of ordinary skills in the art without creative effort shall fall within the protection scope of the present disclosure.

Figure 2:
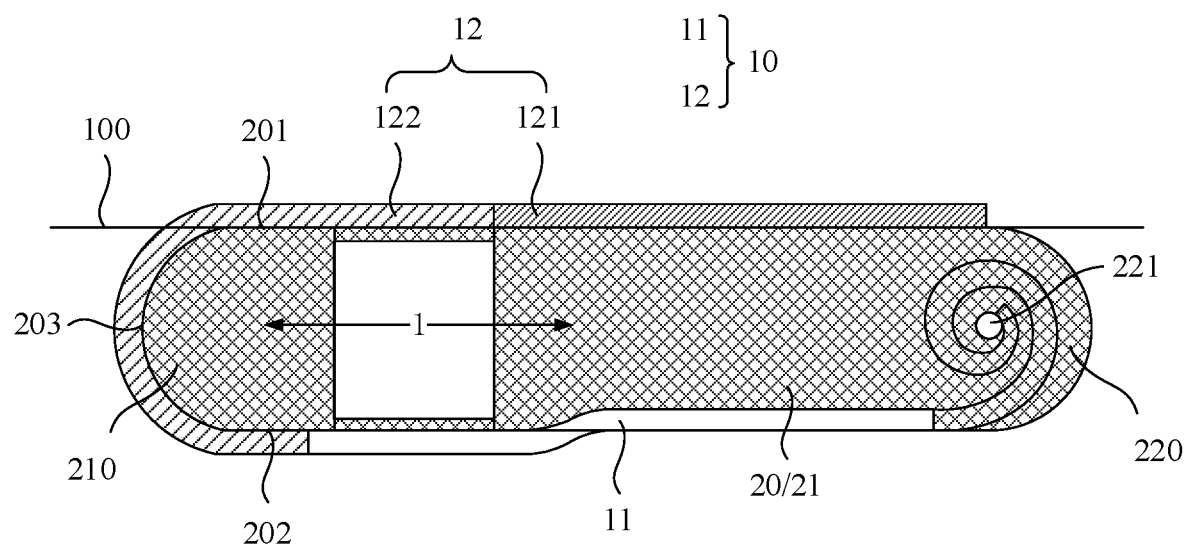
FIG. 2 illustrates a schematic cross-sectional view of the rollable display device shown in FIG. 1.
Figure 3:
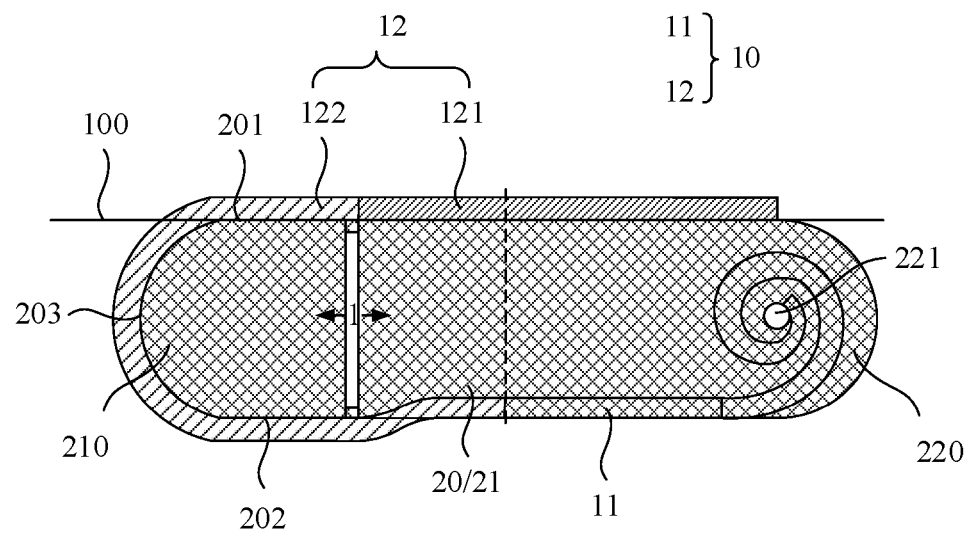
FIG. 3 illustrates a schematic structural diagram of a retracted state of the rollable display device shown in FIG. 1.
Figure 4:
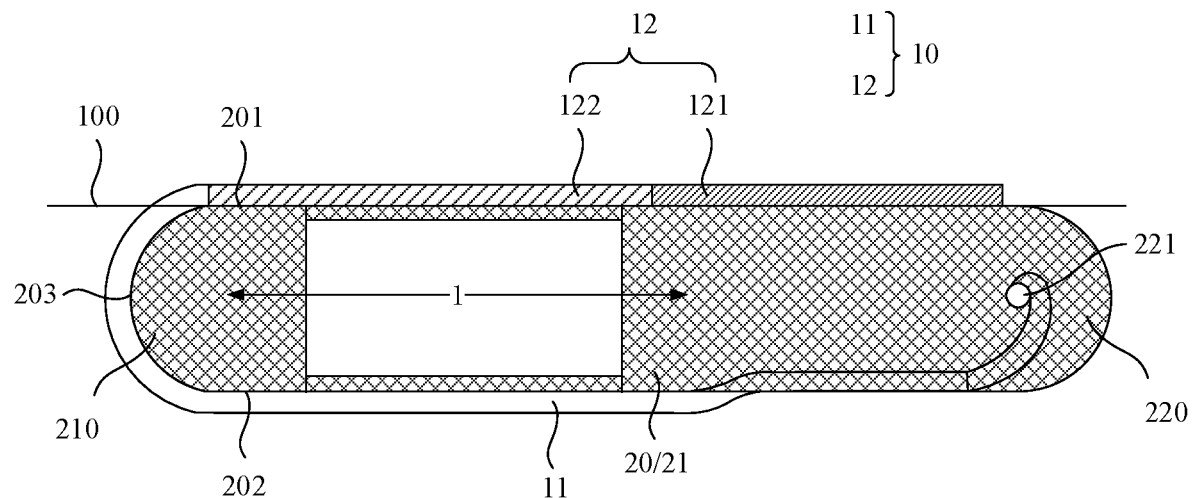
FIG. 4 illustrates a schematic structural diagram of an extended state of the rollable display device shown in FIG. 1.

FIG. 1 illustrates a schematic structural diagram of an exemplary rollable display device according to various embodiments of the present disclosure. FIG. 2 illustrates a schematic cross-sectional view of the rollable display device shown in FIG. 1, FIG. 3 illustrates a schematic structural diagram of a retracted state of the rollable display device shown in FIG. 1, and FIG. 4 illustrates a schematic structural diagram of an extended state of the rollable display device shown in FIG. 1. Referring to FIG. 1 and FIG. 2, the disclosed rollable display device may include a rollable screen 10 and a telescopic mechanism 20. The rollable screen 10 may be laid surrounding the surface of the telescopic mechanism 20. The rollable screen 10 may include a non-display part 11 and a display part 12. The display part 12 may include a fixed display portion 121 and a rollable display portion 122. The fixed display portion 121 may be fixed on a first plane 100 for display. The non-display part 11 may be connected to the side of the rollable display portion 122 away from the display portion 121. The side of the non-display part 11 away from the display part 12 may be connected to the telescopic mechanism 20. In the process of extension or retraction, the telescopic mechanism 20 may drive the rollable display portion 122 through the non-display part 11 to slide and bend on the surface of the telescopic mechanism 20.

Referring to FIG. 3, in the retracted state of the telescopic mechanism 20, the orthogonal projection of the rollable display portion 122 on the first plane 100 and the fixed display portion 121 may at least partially overlap. Referring to FIG. 4, in the extended state of the telescopic mechanism 20, the orthogonal projection of the rollable display portion 122 on the first plane 100 may not overlap with the fixed display portion 121.

The first plane 100 may refer to the light-emitting surface of the rollable display device. When the telescopic mechanism 20 is in either the retracted state or the extended state, the rollable screen 10 may emit light on the light-emitting surface, and the only difference may be the change in the size of the light-emitting area. The fixed display portion 121 of the rollable screen 10 may be fixed on the first plane 100 for display, and the rollable display portion 122 may be able to adjust the display area according to the actual stretching situation. For example, in the process of extension or retraction, the side of the rollable display portion 122 away from the fixed display portion 121 may deviate from the first plane 100, e.g., may bend along the surface of the telescopic mechanism 20, or even bend and extend to the back of the telescopic mechanism 20. At this time, the display region of the rollable display portion 122 that deviates from the first plane 100 may be turned off (e.g., may not display), while the remained region in the first plane 100 may display. Therefore, when the display device is in the fully stretched state, the rollable display portion 122 may be entirely extended in the first plane 100, and accordingly, the display screen may be at the maximum; and when the display device in the fully retracted state, the rollable display portion 122 may be bent and laid against the side and back of the telescopic mechanism 200, and accordingly, the display screen may be at the minimum. As such, in the process of extension or retraction, the display area of the entire rollable display device may be freely adjusted.

The detailed structure of the telescopic mechanism 20 may be designed by those skilled in the art according to actual needs. The telescopic mechanism 20 may need to be designed to have a certain telescopic function, and have a certain telescopic deformation capability during the telescopic process. In addition to the telescopic function, a flat surface may also be required to ensure the laying of the fixed display portion. At the same time, it is also necessary to provide a specific bending structure, storage structure, etc. to ensure that the state of the non-display part and the rollable display portion of the rollable screen changes during the process of extension or retraction, thereby changing the display area on the display surface.

The embodiments of the present disclosure provide a specific structural design for the telescopic mechanism in the rollable display device. Referring to FIG. 1 and FIG. 2, the telescopic mechanism 20 may include a telescopic bracket 21. The telescopic bracket 21 may include a first surface 201 and a second surface 202 opposite to the first surface 201. The first surface 201 and the second surface 202 may be connected by a curved surface 203 at a first end 210 of the telescopic bracket 21. The rollable screen 10 may be laid on and around the first surface 201, the curved surface 203, and the second surface 202 of the telescopic bracket 21. The fixed display portion 121 may be fixed on the first surface 201.

The first surface 201 may be the surface of the telescopic bracket 21 facing the light-emitting side, and the rollable screen on the first surface may form a display surface when displaying images. The first surface 201 may be understood as the front surface of the telescopic bracket 21, and correspondingly, the second surface 202 may be understood as the back surface of the telescopic bracket 21. The areas of the first surface 201 and the second surface 202 may change with the status of the telescopic bracket 21. During the stretching process, the areas of the first surface 201 and the second surface 202 may both gradually increase, and during the retraction process, the areas of the first surface 201 and the second surface 202 may both gradually decrease. For example, the telescopic bracket 21 may have a two-part structure with the two parts separated from each other, so that the entire telescopic bracket 21 can be telescopically deformed. In the extended state, the two parts of the telescopic bracket 21 may be far apart, and thus the first surface 201 may be large. The fixed display portion 121 may be fixed on the first surface 201, that is, the first surface 201 may be display surface of the entire rollable display device. By designing the curved surface 203 and the second surface 202, when the telescopic bracket 21 is retracted, the non-display part 11 and the rollable display portion 122 of the rollable screen 10 may slide and extend to the second surface 202, thereby changing the area of the rollable screen 10 on the first surface 201. During the process, the rollable display portion 122 may slide and extend to the second surface 202, so that the orthogonal projection of the rollable display portion 122 may overlap with the fixed display portion 121. When the telescopic bracket 21 is extended, the rollable display portion 122 of the rollable screen 10 may be rolled on the first surface 201 at the same time as the fixed display portion 121, thereby ensuring the increase of the display area on the first surface 201.

Figure 5:
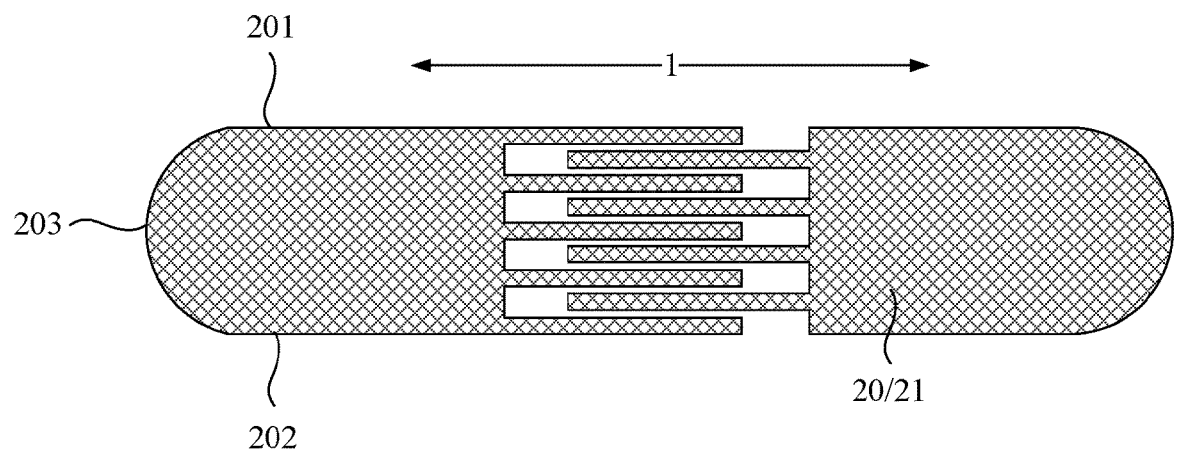
FIG. 5 illustrates a schematic side view of another retractable bracket according to various embodiments of the present disclosure.

FIG. 5 illustrates a schematic side view of another retractable bracket according to various embodiments of the present disclosure. Referring to FIG. 5, in one embodiment, the telescopic bracket 21 may have a two-part structure with the two parts intersecting each other. Because the two parts of the telescopic bracket 21 intersect each other, telescopic deformation may be achieved. In the retracted state, the telescopic bracket 21 may be in a tightly-inserted state. Accordingly, the two parts of the structure may be close to each other, and the first surface 201 may be small. In the extended state, the two parts of the telescopic bracket 21 may change from the tightly-inserted state to a loosely-inserted state. Accordingly, the two parts may be far apart, and the first surface 201 may be large. It should be understood that the structures of the telescopic bracket shown in FIG. 2 and FIG. 5 are both embodiments of the present disclosure, and those skilled in the art may be able to design according to actual structural requirements and process requirements, and the present disclosure does not limit the structure of the telescopic bracket to any specific design.

Further, according to the present disclosure, the traction structure of the non-display part may be integrated on the telescopic mechanism. For example, the telescopic mechanism may be fixed to the side of the non-display part for traction, or the internal structure of the telescopic mechanism may be rolled up, and thus pull the non-display part to move. Further, referring to FIG. 2, a second end 220 of the telescopic bracket 21, opposite to the first end 210, may be provided with a rolling reel 221. The side of the non-display part 11 away from the display part 12 may fixedly connect on the rolling reel 221, and the non-display part 11 may be rollable around the rolling reel 221. The side of the display part 12 away from the non-display part may be fixed on the first surface 201 of the telescopic bracket 21. When extending or retracting in a first direction 1, the telescopic bracket 21 may drive the rollable display portion 122 through the non-display part 11 to slide and bend on the surface of the telescopic mechanism 20. The first direction 1 may be parallel to the first surface 201 and perpendicular to the rolling reel 221.

The rolling reel 221 may be arranged inside the telescopic bracket 21, and the telescopic bracket 21 may be equipped with a cavity structure. When the rolling reel 221 drives the non-display part 11 to roll, the non-display part 11 may be mainly accommodated in the cavity structure. The rolling reel 221 may provide power for rolling, that is, the rolling reel 21 may actively rotate, and thus drive the non-display part 11 to roll. For example, a driving mechanism, a transmission mechanism, etc. may be provided in the telescopic bracket 21 to drive the rolling reel 221 to actively rotate. Alternatively, an elastic mechanism such as a clockwork may be provided in the telescopic bracket 21 to rotate the rolling reel 221 and drive the non-display part 11 to roll up. It should be noted that those skilled in the art may design the driving mechanism of the rolling reel 221 according to actual needs, and the present disclosure does not limit the driving mechanism of the rolling reel 221 to any specific design.

The above provides an example of the telescopic mechanism that can drive the switching of the state in the rollable display device according to various embodiments of the present disclosure. Based on the example, the structure of the rollable screen will be described in detail below.

Figure 6:
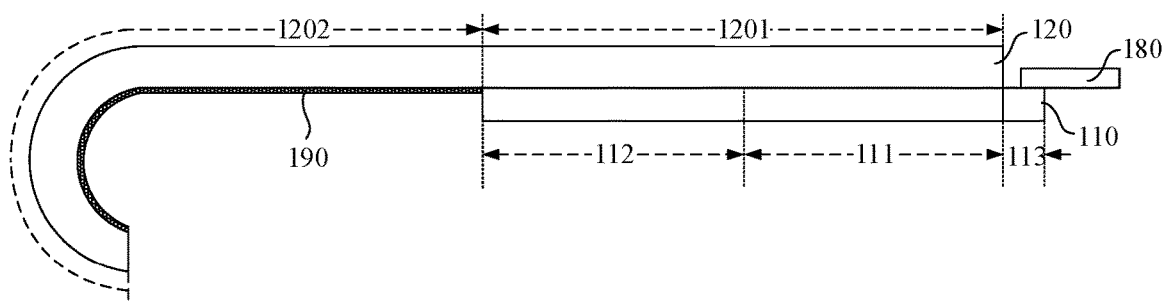
FIG. 6 illustrates a schematic structural diagram of a rollable screen in the exemplary rollable display device shown in FIG. 1.

FIG. 6 illustrates a schematic structural diagram of a rollable screen in the exemplary rollable display device shown in FIG. 1. Referring to FIG. 4 and FIG. 5, the rollable screen 10 may include a flexible display screen 110 and a protective film 120. The protective film 120 may cover the surface of the flexible display screen 110 away from the telescopic bracket 21. The flexible display screen 110 may include a fixing region 111 and a bending and sliding region 112. The portion of the flexible display screen 110 in the fixing region 111 may be fixed on the first surface 201 of the telescopic bracket 21. The portion of the flexible display screen 110 in the bending and sliding region 112 may be laid against the surface of the telescopic bracket 21, and in the process of extension or retraction of the telescopic bracket 21, the portion of the flexible display screen 110 in the bending and sliding region 112 may slide and bend on the first surface 201, the curved surface 203, and the second surface 202. The fixed display portion 121 may include the portion of the flexible display screen 110 in the fixing region 111, and the rollable display portion 122 may include the portion of the flexible display screen 110 in the bending and sliding region 112.

The protective film 120 may include a coverage region 1201 and an extension region 1202. The portion of the protective film 120 in the coverage region 1201 may be attached on the surface of the flexible display screen 110 facing away from the telescopic bracket 21. The portion of the protective film 120 in the extension region 1202 may extend, around the curved surface 203, to the second surface 202. The display part 12 may include the flexible display screen 110 and the portion of the protective film 120 in the coverage region 1201. The non-display part 11 may include the portion of the protective film 120 in the extension region 1202.

The protective film 120 in the rollable screen 10 may be responsible for connecting the flexible display screen 110 and the telescopic bracket 21. During the process of extension or retraction, the telescopic bracket 21 may directly pull the protective film 120 to slide and roll up on the curved surface 203, and at the same time, drive the covered flexible display screen 110 to slide and roll up. The flexible display screen 110 may, for example, include a flexible substrate and a driving circuit layer, an organic display film layer, and an encapsulation layer that are sequentially disposed on the flexible substrate. The flexibility and the bending resistance of the flexible display screen 110 may depend not only on the selection of the film layer and the structure on the film layer, but also on the setting density of the conductive lines and the light-emitting device structures in the driving circuit layer and the organic display film layer. Those skilled in the art may select and design related flexible display screens according to actual needs to meet the rolling requirements of the rollable display device, and the present disclosure does not limit the film structure in the flexible display screen 110 to any specific design.

The flexible display screen 110 may be, for example, divided into two parts that are connected to each other, namely a fixing region 111 and a bending and sliding region 112. The portion of the flexible display screen 110 in the fixing region 111 may be fixed on the first surface 201 of the telescopic bracket 21, and the portion of the flexible display screen 110 in the bending and sliding region 112 may be driven by the protective film 120 to slide on the first surface 201, the curved surface 203, and the second surface 202. The protective film 120 may be divided into a coverage region 1201 and an extension region 1202 that are connected to each other. The portion of the protective film 120 in the coverage region 1201 may be used to protect the flexible display screen 110 from external damage. In addition, the portion of the protective film 120 in the coverage region 1201 may also be used to drive the flexible display screen 110 to bend and slide on the curved surface 203. The portion of the protective film 120 in the extension region 1202 may be responsible for connecting the flexible display screen 110 and the telescopic bracket 21, and thus may transmit the force from the telescopic bracket 21 to the flexible display screen 110 during the process of extension and retraction. The portion of the protective film 120 in the coverage region 1201 may be transparent, so as to transmit the light emitted by the flexible display screen 110. For the portion of the protective film 120 in the extension region 1202, to shield the covered structure, the portion of the protective film 120 may be shaded. For example, the surface of the protective film 120 facing the telescopic bracket 21 may be referred to as the inner surface, and the an ink layer 190 may be provided on the inner surface of the portion of the protective film 120 in the extension region 1202. The ink layer 190 may mainly play a role of shading or absorbing light. In addition to ensuring the protection for the covered structure, the ink layer 190 may also be used to accurately divide the region where the flexible display screen 110 is located.

It should be noted that when the telescopic bracket 21 is in the retraction state, a part of the protective film 120 in the extension region 1202 may become redundant, and thus a corresponding setting may be required to store the redundant protective film 120. For example, referring to FIGS. 2-4, a rolling reel 221 may be provided at the second end 220 of the telescopic bracket 21. The rolling reel 221 may be used to provide stretching force for the protective film 120, and in addition, the rolling reel 221 may also be used to accommodate the protective film 120, thereby ensuring that the entire rollable display device has a simple and regular structure.

Further, referring to FIG. 6, in the rollable display device described above, the rollable screen may also be provided with a flexible circuit board 180; and the flexible display screen 110 may also include a step region 113. The step region 113 may be provided with a plurality of bonding pads (not shown), and the flexible circuit board 180 may be bound to the bonding pads. The flexible circuit board 180 may be connected to a main board that drives the display, and may control the flexible display screen 110 to display pictures by transmitting the display-driving signal of the main board. The bonding pads may provide driving signals, power signals, etc. to each pixel part through signal lines arranged in the flexible display screen 110. For example, the step region 113 may be arranged on the side of the flexible display screen 110 away from the bending and sliding region 112, that is, the flexible circuit board 180 may be arranged on the side of the display part away from the non-display part, or may be located on the side of the fixed display portion of the display part away from the rollable display portion. At this time, when the non-display part drives the rollable display portion to bend and slide, the flexible circuit board 180 may be located on the far side, and thus may be able to prevent the stretching force of the non-display part from acting on the bonding pad. As such, the connection between the flexible circuit board and the bonding pad may be ensured, and the risk of disconnection can be avoided.

In addition, it should be understood that because the rollable display device has a variety of image-display states with different display areas, in the process of driving the display through the flexible circuit board 180, the main board may provide display-driving signal according to the actual area of the flexible display screen 110 on the first plane, e.g., the display surface, so as to coordinate with the extension or retraction state to display the corresponding screen.

Figure 7:
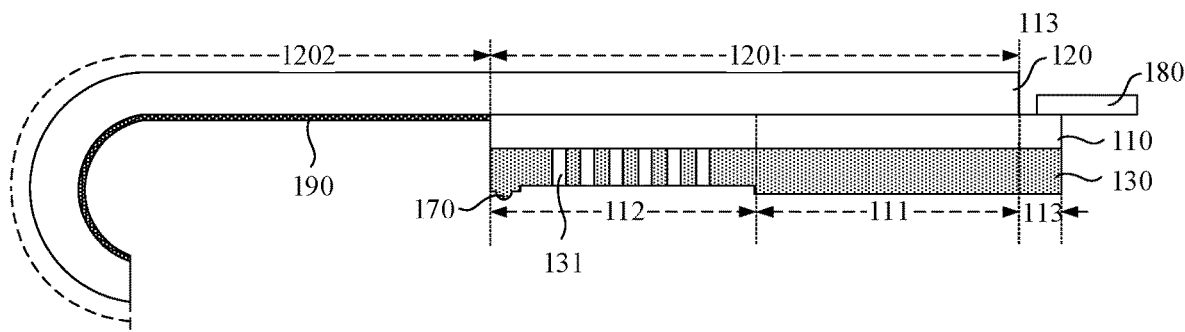
FIG. 7 illustrates a schematic structural diagram of a rollable screen in another exemplary rollable display device according to various embodiments of the present disclosure.

On the basis of the rollable display device described above, the embodiments of the present disclosure provide a detailed structure corresponding to the actual application process. FIG. 7 illustrates a schematic structural diagram of a rollable screen in another exemplary rollable display device according to various embodiments of the present disclosure. Referring to FIG. 4 and FIG. 7, in the rollable display device, the rollable screen 10 may further include a supporting plate 130. The supporting plate 130 may be disposed between the flexible display screen 110 and the telescopic bracket 21. The supporting plate 130 may include a region, corresponding to the bending and sliding region 112 of the flexible display screen 110. The region of the supporting plate 130 corresponding to the bending and sliding region 112 of the flexible display screen 110 may be provided with a plurality of through holes 131.

The supporting plate 130 may be mainly used to support the flexible display screen 110, and at the same time, through the supporting plate 130, the adhesion or mounting between the flexible display screen 110 and the telescopic bracket 21 may be realized, so as to prevent the flexible display screen from being damaged during the bounding process. The supporting plate 130 corresponding to the flexible display screen 110 may also be divided into two parts, e.g., corresponding to the fixing region 111 and the bending and sliding region 112, respectively. The portion of the flexible display screen 110 in the bending and sliding region 112 may also be supported by the supporting plate 130 when sliding and bending, that is, the supporting plate 130 may also need to slide and bend. The supporting plate 130 may be made of a material with desired rigidity for providing support. At the same time, a plurality of through holes 131 may be provided in the region of the supporting plate 130 that corresponds to the bending and sliding region 112 to reduce the rigidity and strength of the supporting plate 130 in the region, such that the supporting plate 130 may demonstrate a certain degree of flexibility in the region, and thus may be bendable.

Further, referring to FIG. 7, considering that the supporting plate 130 is in direct contact with the telescopic bracket 21, the supporting plate 130 according to the embodiments of the present disclosure may be provided with a plurality of protruding structures 170 on the surface facing away from the flexible display screen 110 and at the edge close to the first end 210. The protruding structure 170 may be an arc-shaped protruding structure or an arc-shaped strip structure. The arc-shaped protruding structure 170 may reduce the contact area between the supporting plate 130 and the telescopic bracket 21, thereby reducing the friction during the sliding process, reducing the sliding resistance, improving the wear resistance of the supporting plate 130, and increasing the life of the supporting plate 130. It should be noted that the quantity, the size, and the arrangement of the protruding structures 170 may be designed by those skilled in the art according to actual needs and actual processes, and are not limited in the present disclosure.

Figure 8:
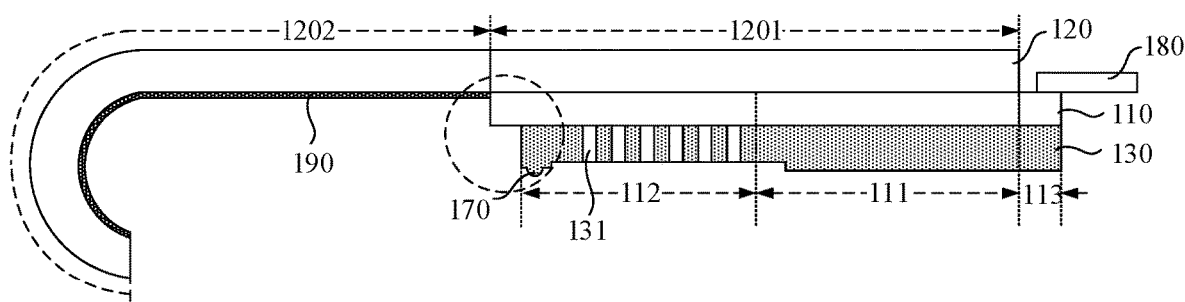
FIG. 8 illustrates a schematic structural diagram of a rollable screen in another exemplary rollable display device according to various embodiments of the present disclosure.

FIG. 8 illustrates a schematic structural diagram of a rollable screen in another exemplary rollable display device according to various embodiments of the present disclosure. Referring to FIG. 4 and FIG. 8, in some embodiments, the side edges of the supporting plate 130 and the flexible display screen 110 that are adjacent to the first end 210 may be arranged into a step structure. At this time, although the flexible display screen 110 and the supporting plate 130 located between the telescopic bracket 21 and the protective film 120 have a certain thickness, because the side edges of the supporting plate 130 and the flexible display screen 110 are arranged into a step structure, the side edges of the supporting plate 130 and the flexible display screen 110 may have a smooth transition, thereby effectively avoiding gap formation due to an edge segment difference.

Figure 9:
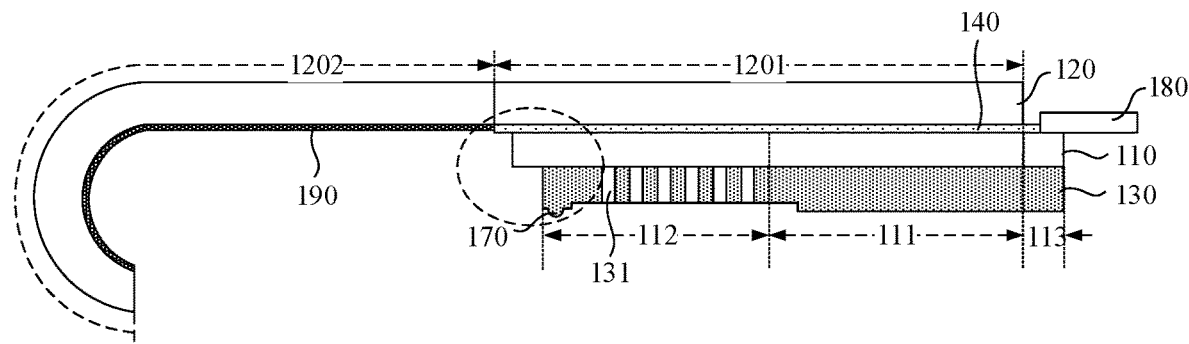
FIG. 9 illustrates a schematic structural diagram of a rollable screen in another exemplary rollable display device according to various embodiments of the present disclosure.

FIG. 9 illustrates a schematic structural diagram of a rollable screen in another exemplary rollable display device according to various embodiments of the present disclosure. Referring to FIG. 4 and FIG. 9, in some embodiments, to protect the flexible display screen 110 in a semi-finished stage, a glassy film 140 may be added to the surface of the light-emitting surface of the flexible display screen 110, that is, the glassy film 140 may be located between the flexible display screen 110 and the protective film 120. At this time, the side edges of the glassy film 140, the supporting plate 130, and the flexible display screen 110 that are adjacent to the first end 210 may be arranged into a step structure. Similar to that in the embodiment described above, by arranging the side edges of the glassy film 140, the supporting plate 130, and the flexible display screen 110 that are adjacent to the first end 210 in the step structure, the thicknesses of the film layers may be smoothly transitioned, thereby avoiding gap formation due to an edge segment difference.

Figure 10:
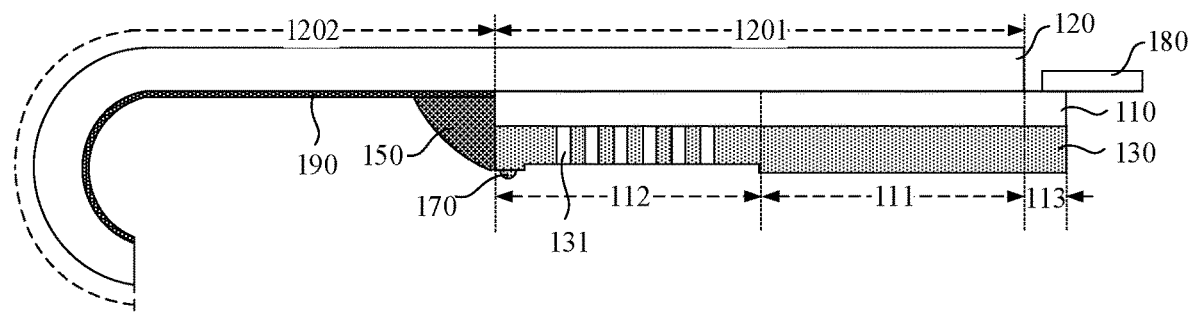
FIG. 10 illustrates a schematic structural diagram of a rollable screen in another exemplary rollable display device according to various embodiments of the present disclosure.

In addition to using the step structure to solve the problem of having an edge segment difference between the protective film 120 and the telescopic bracket 21 as described above, the embodiments of the present disclosure also provide other ways to avoid gap formation due to an edge segment difference. FIG. 10 illustrates a schematic structural diagram of a rollable screen in another exemplary rollable display device according to various embodiments of the present disclosure. Referring to FIG. 4 and FIG. 10, in some embodiments, a dispensing structure 150 may be disposed on the sidewalls of the supporting plate 130 and the flexible display screen 110 that are adjacent to the first end 210. The side of the dispensing structure 150 away from the supporting plate 130 and the flexible display screen 110 may include a smooth-slope structure.

The dispensing structure 150 may be essentially glue coated on the sidewalls of the supporting plate 130 and the flexible display screen 110. The use of glue may avoid the separation between the edges of the film layers, and also prevent dust, moisture, etc. from passing through the interface between film layers. At the same time, making the glue a smooth slope structure may ensure a smooth transition between the thicknesses of the supporting plate 130 and the flexible display screen 110, thereby avoiding gap formation due to an edge segment difference.

Figure 11:
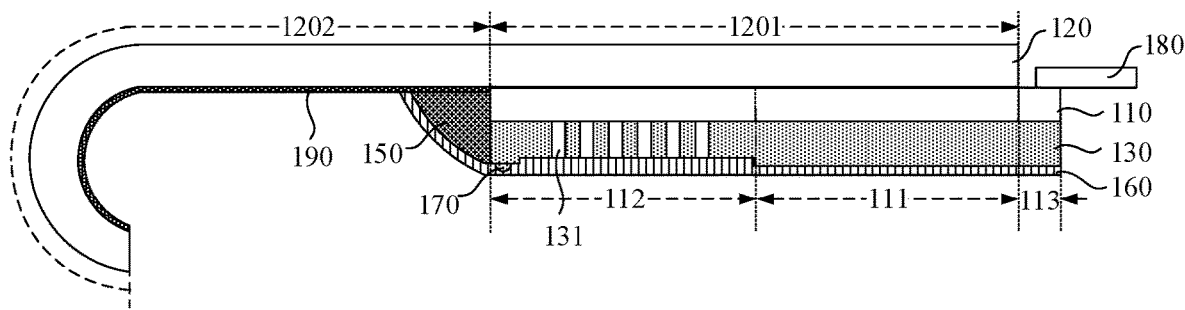
FIG. 11 illustrates a schematic structural diagram of a rollable screen in another exemplary rollable display device according to various embodiments of the present disclosure.

FIG. 11 illustrates a schematic structural diagram of a rollable screen in another exemplary rollable display device according to various embodiments of the present disclosure. Referring to FIG. 4 and FIG. 11, in some embodiments, in addition to the structure of the supporting plate 130 described above, a wrapping film 160 may also be provided in the rollable screen. The wrapping film 160 may be attached to the surface of the supporting plate 130 facing away from the flexible display screen 110, and attached to the sidewalls of the supporting plate 130 and the flexible display screen 110 that are adjacent to the first end 210.

The difference between the rollable display device shown in FIG. 11 and the rollable display device shown in FIG. 10 is only that a wrapping film 160 is provided in the rollable display device shown in FIG. 11. The function of the wrapping film 160 may include wrapping the surface of the supporting plate 130 and the flexible display screen 110 facing the telescopic bracket 21 to protect the back structure of the flexible display screen 110. The wrapping film 160 may need to have a certain degree of flexibility, so an organic polymer material with a certain degree of tensile strength and wear resistance may be selected for forming the wrapping film 160. For example, the wrapping film 160 may be a polyimide film, a polyethylene terephthalate film, or any other appropriate organic polymer film. Therefore, in the rollable display device shown in FIGS. 4-6, a wrapping film 160 may also be provided in the rollable screen, and the wrapping film 160 may be attached to the surface of the supporting plate 130 facing away from the flexible display screen 110 and attached to the sidewalls of the supporting plate 130 and the flexible display screen 110 that are adjacent to the first end 210.

It should be noted that in the rollable display device described above, because the protective film 120 is responsible for protection and stretching, the protective film 120 may need to have a certain degree of tensile strength, and also a certain degree of wear resistance. Therefore, the detailed structure and material selection of the protective film 120 may need to be reasonably selected and designed. As for the material of the protective film 120, similarly, an organic polymer material with a certain degree of tensile strength and wear resistance may be selected for forming the protective film 120. For example, the protective film 120 may be a polyimide film, a polyethylene terephthalate film, or any other appropriate organic polymer film.

Figure 12:
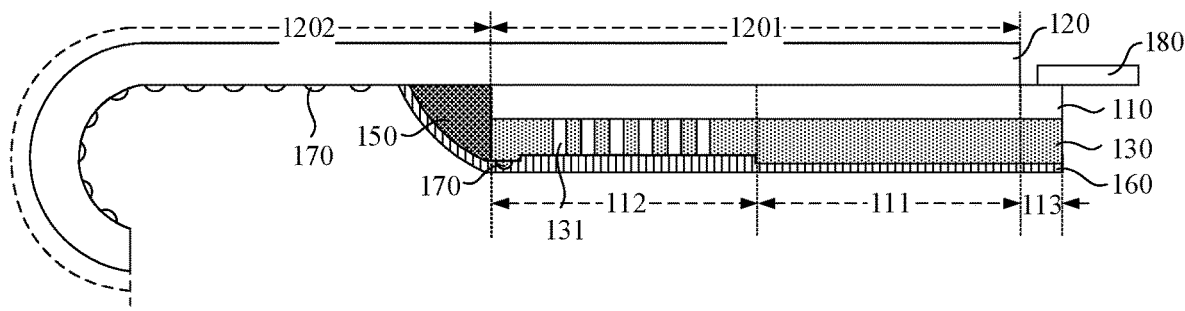
FIG. 12 illustrates a schematic structural diagram of a rollable screen in another exemplary rollable display device according to various embodiments of the present disclosure.

From the perspective of structural design, to improve the tensile strength and wear resistance of the protective film, the embodiments of the present disclosure also provide multiple solutions. FIG. 12 illustrates a schematic structural diagram of a rollable screen in another exemplary rollable display device according to various embodiments of the present disclosure. Referring to FIG. 4 and FIG. 12, the surface of the protective film 120 facing the telescopic bracket 21 may be referred to as the inner surface, and the portion of the inner surface of the protective film 120 in the extension region 1202 may be provided with a plurality of protruding structures 170. Adding the plurality of protruding structures 170 on the protective film 120 may be able to increase the thickness of the protective film 120 to a certain extent, thereby improving the strength of the protective film 120. In addition, because of the design of the protruding structure 170, when the protective film 120 is attached to the surface of the telescopic bracket 21, the contact area with the surface of the telescopic bracket 21 may be small, thereby reducing frictional resistance, improving the wear resistance of the protective film, and improving the service life. Exemplarily, the protruding structure 170 may be an arc-shaped protruding structure or an arc-shaped strip structure. It should be noted that those skilled in the art can also adjust the shape of the protruding structure 170 according to the actual improvement effect, and the detailed shape of the protruding structure 170 is not limited in the present disclosure.

In addition, considering the repeated friction and sliding between the protective film and the telescopic bracket, when designing the protective film, a polished region may be provided on the inner surface of the extension region of the protective film, and the friction coefficient of the polished region may be smaller than the friction coefficient of the other regions of the protective film. The polished region of the protective film may be essentially an area formed after improving the surface flatness of the protective film by polishing. The surface roughness of the polished region may be reduced, and the friction coefficient may be reduced. When sliding on the telescopic bracket and rolling up on the rolling reel, the friction in the polished region may be smaller, and thus the wear resistance may be improved, and the service life of the protective film may be extended.

Figure 13:
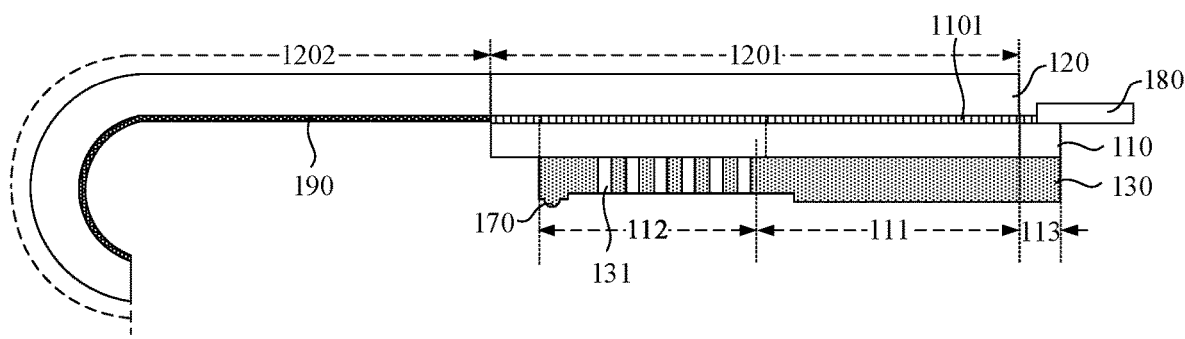
FIG. 13 illustrates a schematic structural diagram of a rollable screen in another exemplary rollable display device according to various embodiments of the present disclosure.

To improve the tensile strength of the protective film, while taking the actual preparation and assembly process into account, the embodiments of the present disclosure provide another rollable display device. FIG. 13 illustrates a schematic structural diagram of a rollable screen in another exemplary rollable display device according to various embodiments of the present disclosure. Referring to FIG. 4 and FIG. 13, the flexible display screen may include a polarizing film 1101. The polarizing film 1101 may be located on the surface of the flexible display screen 110 adjacent to the protective film 120. The polarizing film 1101 and the protective film 120 may be adhered together. The polarizing film 1101 and the protective film 120 being adhered together may refer to that in the preparation process of the flexible display screen, the polarizing film 1101 may need to be attached to the surface of the flexible display screen 110. At the same time, the protective film 120 may need to be attached to the surface of the polarizing film 1101. For example, the protective film 120 may be attached to the polarizing film 1101, and then the polarizing film 1101 may be attached the surface of the screen to complete the flexible display screen 110. In one embodiment, the polarizing film 1101 and the protective film 120 may be equivalent to an integrated film layer, and the polarizing film 1101 can be used to improve the tensile strength of the protective film 120.

According to the disclosed rollable display device, the display panel includes a rollable screen and a telescopic mechanism. The rollable screen is laid surrounding the surface of the telescopic mechanism. Further, the rollable screen is arranged to include a non-display part and a display part, and the display part includes a fixed display portion and a rollable display portion that are connected with each other. The fixed display portion is fixed in a first plane for display. The non-display part is connected to the side of the rollable display portion away from the fixed display portion. The side of the non-display part away from the display part is connected to the telescopic mechanism. In the process of extension or retraction, through the non-display part, the telescopic mechanism drives the rollable display portion to slide and bend on the surface of the telescopic mechanism. In the retracted state of the telescopic mechanism, the orthogonal projection of the rollable display portion on the first plane and the fixed display portion at least partially overlap. In the extended state of the telescopic mechanism, the orthogonal projection of the rollable display portion on the first plane unoverlaps with the fixed display portion. As such, change in the display area of the rollable display device may be achieved. The embodiments of the present disclosure solve the problem that the flexible screen in existing rollable display device is easily warped, and use a telescopic mechanism to drive the state of the display portion to switch through the non-display part. Therefore, the disclosed rollable display device not only realizes the change of the display area, but also prevents the flexible display screen in the display part from being directly subjected to deformation stress, thereby reducing the damage to the flexible display screen caused by the stretching force or the winding force, and preventing the flexible display screen from deformation such as warping. As such, the flatness of the display screen may be ensured, and the quality of the rollable display device may be improved, thereby increasing the life time of the rollable display device.

It should be noted that the embodiments described above provide various implementations for improving the strength and wear resistance of the protective film in rollable screens, and also provide various implementations for adjusting the edge segment difference between the protective film and the telescopic bracket. Those skilled in the art may make any reasonable selection according to the actual rollable screen structure, which is not limited by the present disclosure.

It should be noted that the above are only some embodiments of the present disclosure and the applied technical principles. Those skilled in the art shall understand that the present disclosure is not limited to the specific embodiments described herein, and various obvious changes, readjustments, combinations and substitutions can be made without departing from the protection scope of the present disclosure. Therefore, although the present disclosure has been described in detail through the above embodiments, the present disclosure is not limited to the above embodiments, and can also include other equivalent embodiments without departing from the principle of the present disclosure. Any equivalent or modification thereof, without departing from the spirit and principle of the present disclosure, falls within the true scope of the present disclosure.

What is claimed is:

1. A rollable display device, comprising:
 a rollable screen, including a non-display part and a display part; and
 a telescopic mechanism, wherein:
  the telescopic mechanism includes a telescopic bracket, the telescopic bracket includes a curved surface at a first end of the telescopic bracket, and a second end of the telescopic bracket, opposite to the first end, is provided with a rolling reel,
  the rollable screen is laid surrounding a surface of the telescopic mechanism,
  the display part includes a fixed display portion and a rollable display portion that are connected to each other, the rollable display portion being rollable around the curved surface at the first end of the telescopic bracket, the fixed display portion is fixed on a first plane for display, and the non-display part is connected to a side of the rollable display portion away from the fixed display portion, a side of the non-display part away from the display part is connected to the rolling reel of the telescopic mechanism, and the non-display part is rollable around the rolling reel, in a process of extension or retraction, the telescopic mechanism is configured to drive the rollable display portion, through the non-display part, to slide and bend on the surface of the telescopic mechanism, and at least a portion of the non-display part is rolled around the rolling reel to form a circularly rolled portion during the retraction process and at least a portion of the circularly rolled portion of the non-display part is released from the rolling reel during the extension process, a projection of the rolling reel on the first plane overlaps with one side of the fixed display portion away from the rollable display portion, in a retracted state of the telescopic mechanism, an orthogonal projection of the rollable display portion on the first plane at least partially overlaps with the fixed display portion, in an extended state of the telescopic mechanism, an orthogonal projection of the rollable display portion on the first plane does not overlap with the fixed display portion, the telescopic bracket includes a first surface, a second surface opposite to the first surface, and the curved surface connects the first surface with the second surface, the rollable screen is laid on and around the first surface, the curved surface, and the second surface of the telescopic bracket, and the fixed display portion is fixed on the first surface, the rollable screen includes a flexible display screen and a protective film, and the protective film covers a surface of the flexible display screen away from the telescopic bracket, the flexible display screen includes a fixing region and a bending and sliding region, the fixing region of the flexible display screen is fixed on the first surface of the telescopic bracket, the bending and sliding region of the flexible display screen is laid against a surface of the telescopic bracket, and in a process of extension or retraction of the telescopic bracket, the bending and sliding region of the flexible display screen slides and bends on the first surface, the curved surface, and the second surface of the telescopic bracket, the fixed display portion includes the fixing region of the flexible display screen, and the rollable display portion includes the bending and sliding region of the flexible display screen, the protective film includes a coverage region and an extension region, the coverage region of the protective film is attached on a surface of the flexible display screen facing away from the telescopic bracket, and the extension region of the protective film extends, around the curved surface, to the second surface, and the display part includes the flexible display screen and the coverage region of the protective film, and the non-display part includes the extension region of the protective film, and the rollable screen further includes a supporting plate, the supporting plate is disposed between the flexible display screen and the telescopic bracket, and the supporting plate includes a region, corresponding to the bending and sliding region of the flexible display screen and provided with a plurality of through holes.

2. The rollable display device according to claim 1, wherein:

a side of the display part away from the non-display part is fixed on the first surface of the telescopic bracket;

when extending or retracting along a first direction, the telescopic bracket is configured to drive the rollable display portion, through the non-display part, to slide and bend on the surface of the telescopic mechanism; and the first direction is parallel to the first surface and perpendicular to the rolling reel.

3. The rollable display device according to claim 1, wherein:

the supporting plate is provided with a plurality of protruding structures on a surface facing away from the flexible display screen and at an edge close to the first end.

4. The rollable display device according to claim 3, wherein:

the plurality of protruding structures includes arc-shaped protruding structures and arc-shaped strip structures.

5. The rollable display device according to claim 1, wherein:

side edges of the supporting plate and the flexible display screen that are adjacent to the first end are arranged into a step structure.

6. The rollable display device according to claim 5, wherein:

the rollable screen further includes a glassy film, wherein:
the glassy film is located between the flexible display screen and the protective film; and
side edges of the glassy film, the supporting plate, and the flexible display screen that are adjacent to the first end are arranged into a step structure.

7. The rollable display device according to claim 1, wherein:

a dispensing structure is configured on sidewalls of the supporting plate and the flexible display screen that are adjacent to the first end, wherein:
a side of the dispensing structure away from the supporting plate and the flexible display screen includes a smooth-slope structure.

8. The rollable display device according to claim 1, wherein:

the rollable screen further includes a wrapping film, wherein the wrapping film is attached to a surface of the supporting plate facing away from the flexible display screen and attached to sidewalls of the supporting plate and the flexible display screen that are adjacent to the first end.

9. The rollable display device according to claim 8, wherein:

when a surface of the protective film facing toward the telescopic bracket is an inner surface, the wrapping film is further attached to the inner surface of the extension region of the protective film.

10. The rollable display device according to claim 8, wherein:

when a surface of the protective film facing toward the telescopic bracket is an inner surface, a plurality of protruding structures is disposed on the inner surface of the extension region of the protective film.

11. The rollable display device according to claim 10, wherein:
the plurality of protruding structures includes arc-shaped protruding structures and arc-shaped strip structures.

12. The rollable display device according to claim 8, wherein:
when a surface of the protective film facing toward the telescopic bracket is an inner surface, the inner surface of the extension region of the protective film includes a polished region; and
a friction coefficient of the polished region is smaller than a friction coefficient of other regions of the protective film.

13. The rollable display device according to claim 1, wherein:
when a surface of the protective film facing toward the telescopic bracket is an inner surface, an ink layer is configured on the inner surface of the extension region of the protective film.

14. The rollable display device according to claim 1, wherein:
the flexible display screen includes a polarizing film, wherein:
the polarizing film is located on a side of the flexible display screen adjacent to the protective film; and
the polarizing film and the protective film are adhered together.

15. A rollable display device, comprising:
a rollable screen, including a non-display part and a display part; and
a telescopic mechanism, wherein:
the telescopic mechanism includes a telescopic bracket, the telescopic bracket includes a curved surface at a first end of the telescopic bracket, and a second end of the telescopic bracket, opposite to the first end, is provided with a rolling reel,
the rollable screen is laid surrounding a surface of the telescopic mechanism,
the display part includes a fixed display portion and a rollable display portion that are connected to each other, the rollable display portion being rollable around the curved surface at the first end of the telescopic bracket,
the fixed display portion is fixed on a first plane for display, and the non-display part is connected to a side of the rollable display portion away from the fixed display portion,
a side of the non-display part away from the display part is connected to the rolling reel of the telescopic mechanism, and the non-display part is rollable around the rolling reel,
in a process of extension or retraction, the telescopic mechanism is configured to drive the rollable display portion, through the non-display part, to slide and bend on the surface of the telescopic mechanism, and at least a portion of the non-display part is rolled around the rolling reel to form a circularly rolled portion during the retraction process and at least a portion of the circularly rolled portion of the non-display part is released from the rolling reel during the extension process,
a projection of the rolling reel on the first plane overlaps with one side of the fixed display portion away from the rollable display portion,
in a retracted state of the telescopic mechanism, an orthogonal projection of the rollable display portion on the first plane at least partially overlaps with the fixed display portion,
in an extended state of the telescopic mechanism, an orthogonal projection of the rollable display portion on the first plane does not overlap with the fixed display portion,
the telescopic bracket includes a first surface, a second surface opposite to the first surface, and the curved surface connects the first surface with the second surface, the rollable screen is laid on and around the first surface, the curved surface, and the second surface of the telescopic bracket; and the fixed display portion is fixed on the first surface,
the rollable screen includes a flexible display screen and a protective film, the protective film covers a surface of the flexible display screen away from the telescopic bracket, the flexible display screen includes a fixing region and a bending and sliding region, the fixing region of the flexible display screen is fixed on the first surface of the telescopic bracket, the bending and sliding region of the flexible display screen is laid against a surface of the telescopic bracket, and in a process of extension or retraction of the telescopic bracket, the bending and sliding region of the flexible display screen slides and bends on the first surface, the curved surface, and the second surface of the telescopic bracket,
the fixed display portion includes the fixing region of the flexible display screen, and the rollable display portion includes the bending and sliding region of the flexible display screen,
the protective film includes a coverage region and an extension region, the coverage region of the protective film is attached on a surface of the flexible display screen facing away from the telescopic bracket, and the extension region of the protective film extends, around the curved surface, to the second surface,
the display part includes the flexible display screen and the coverage region of the protective film, and the non-display part includes the extension region of the protective film,
the rollable screen further includes a flexible circuit board; and
the flexible display screen further includes a step region.

* * * * *